(12) United States Patent
Vidovich

(10) Patent No.: US 6,226,045 B1
(45) Date of Patent: May 1, 2001

(54) DOT CLOCK RECOVERY METHOD AND APPARATUS

(75) Inventor: Nikola Vidovich, San Jose, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 08/960,539

(22) Filed: Oct. 31, 1997

(51) Int. Cl.[7] .................................................. H04N 9/64
(52) U.S. Cl. ........................ 348/539; 348/539; 348/572
(58) Field of Search ................................. 348/537, 572, 348/574, 573, 500, 536, 538, 539; 341/158; H04N 9/64

(56) References Cited

U.S. PATENT DOCUMENTS

| 3,619,491 | 11/1971 | Fujita | 178/5.4 CD |
|---|---|---|---|
| 4,729,025 | 3/1988 | Yanase | 358/166 |
| 4,791,488 | 12/1988 | Fukazawa et al. | 358/149 |
| 4,864,399 | 9/1989 | Romesburg et al. | 358/148 |
| 4,998,169 | 3/1991 | Yoshioka | 358/148 |
| 5,483,294 | 1/1996 | Kays | 348/609 |
| 5,539,473 | 7/1996 | Kommrusch et al. | 348/537 |
| 5,731,843 | * 3/1998 | Cappels | 348/537 |

FOREIGN PATENT DOCUMENTS 9-62222 * 3/1997 (JP) ................................. H04N/5/66

* cited by examiner

*Primary Examiner*—David E. Harvey
(74) *Attorney, Agent, or Firm*—Flehr Hohbach Test Albritton & Herbert

(57) ABSTRACT

The present invention overcomes the problem of image detail timing jitters in flat panel display devices by compensating for the phase difference between the dot clock derived by the Horizontal-sync signal and the display data. This is done by providing an apparatus and method for detecting the phase difference between the red, green and blue signal transitions and the dot clock signal that has been regenerated from the Horizontal sync signal. The detected phase difference is then applied, in a feedback fashion, to synchronize the dot clock phase with the signal transitions.

24 Claims, 7 Drawing Sheets

DOT CLOCK RECOVERY METHOD AND APPARATUS

FIELD OF THE INVENTION

The present invention is directed generally to a phase locked loop ("PLL") device that regenerates the frequency and the phase of a host computer dot clock, for use by flat panel displays, and more specifically to a PLL device and method for detecting the phase difference between red, green and blue signal transitions and the regenerated pixel clock so that the difference can be fed back to maintain the clock phase constant relative to signal transitions.

BACKGROUND OF THE INVENTION

The information displayed on cathode ray tube ("CRT") video display devices, used with equipment such as personal computers, is driven by analog video signals. As shown in FIG. 1, a typical analog video signal is a composite signal having analog data combined with other sweep and synchronization signals. Synchronization signals are embedded within the composite video signal at predetermined voltage levels, which are recognized as synch levels. The synch level of a video signal is used by the CRT interface to cue the electron beam of the CRT to change either a scan line or a frame when displaying information. When the sync level cues the electron beam to start at the next scan line, it is called a horizontal sync ("H-sync").

With the cost of digital display devices, such as liquid crystal displays ("LCD") or thin film transistor displays dramatically decreasing in recent years, CRT's are being replaced in the computer industry by the use of flat panel displays ("FPD") on personal computers and by the increased popularity of notebook computers, such as the Hitachi Visionbook products.

Digital video displays are driven by digital pixel data instead of analog video signals. Thus, analog video signals generated by the host computer must be converted into the digital domain by an analog to digital converter in order to be used by digital display devices. In the conversion of display information from analog to digital pixel data, a dot (pixel) clock signal in the FPD must be synchronized with the original dot clock signal which was used to create the analog video signals.

Unfortunately, the CRT interface of a typical personal computer does not include a dot clock signal, which would be used by the FPD during the generation of display data. Therefore, interface circuitry for LCD and other FPD devices must use a PLL circuit or other synchronizing circuits to regenerate the dot clock signal from the H-sync transmitted by the host computer (see FIG. 2).

For example, U.S. Pat. No. 4,791,488, issued on Dec. 13, 1996, provides a method for accurate dot clock phase matching to a composite video signal. This is achieved by synchronizing the horizontal sync pulse to the dot clock and providing matched propagation delays up to the analog to digital conversion circuitry. The dot clock timing, however, is referenced only to the start of the horizontal sync signal. This can lead to timing jitters due to H-sync signal tolerances, as described below. U.S. Pat. No. 4,998,169, issued on Mar. 5, 1991, discloses a circuit for the flat panel dot clock regeneration without using a phase locked loop. In this disclosure, the horizontal drive is used to reset counters at the beginning of the horizontal line scan. In U.S. Pat. No. 4,864,399, issued on Sep. 5, 1989, a circuit is provided to correct chroma demodulation for digital TV receivers In the circuit disclosed, the A/D clock phase is updated at the start of each horizontal drive.

Under current Video Electronic Standards Association ("VESA") timing standards, the H-sync time period has a prescribed number of clock pulses for each of the different image resolutions. For example, VESA standards set the extended graphics array ("XGA") mode line period at 1344 clock pulses, for a 60 Hz refresh rate. One clock period is therefore $\frac{1}{1344}$ or 0.075% of the line length. VESA standards further provide that the tolerance for the dot clock used by the random access memory digital to analog converter ("RAMDAC") for converting display data into analog signal transitions is less than + or −0.5% from the nominal values, a deviation that is several times larger than the 0.075% dot clock width of the horizontal period. Therefore, synchronizing the H-sync signal to video signal transitions alone cannot be used to accurately recover the dot clock frequency. The line period will have the number of clock pulses which is either larger or smaller than the standard requires, depending on the frequency tolerance. In XGA mode, for example, the number of clock pulses may deviate up to ±6 clock periods.

Signal transitions are, however, synchronous with and in phase with the dot clock at the RAMDAC output of the host computer. In addition, the H-sync signal is synchronous with the dot clock signals. Unfortunately, the leading edge timing of the H-sync signal relative to signal transitions is not defined by the VESA standards (or other applicable standards). The lack of specific parameters for the H-sync signal timing produces a regenerated dot clock signal based on the H-sync signal that, for flat panel displays, doesn't always synchronize in phase with video signals. This results in FPD image details that exhibit a high amount of timing jitters.

Accordingly, what is needed is a device and method for synchronizing the regenerated dot clock signal with the H-sync signals and voltage transitions of analog video signals, that overcomes the deficiencies and inadequacies of the prior art devices while complying with current timing standards.

It is, therefore, an object of the present invention to provide an apparatus and method for regenerating an accurate dot clock period from the H-sync signal and for recovering an accurate dot clock phase from the signal transitions of the red, green and blue analog video signals.

It is still another object of the present invention to accomplish to above-stated object by utilizing a phase lock loop method and apparatus which is simple in design and use, and efficient to manufacture.

The foregoing objects and advantages of the invention are illustrative of those which can be achieved by the present invention and are not intended to be exhaustive or limiting of the possible advantages which can be realized. Thus, these and other objects and advantages of the invention will be apparent from the description herein or can be learned from practicing the invention, both as embodied herein or as modified in view of any variation which may be apparent to those skilled in the art. Accordingly, the present invention resides in the novel methods, arrangements, combinations and improvements herein shown and described.

SUMMARY OF THE INVENTION

In accordance with these and other objects of the invention, a brief summary of the present invention is presented. Some simplifications and omissions may be made in the following summary, which is intended to highlight and introduce some aspects of the present invention, but not to limit its scope. Detailed descriptions of a preferred exemplary embodiment adequate to allow those of ordinary skill in the art to make and use the inventive concepts will follow in later sections.

According to a broad aspect of the invention, an apparatus and method is disclosed for a digital display device having an apparatus for applying the phase differences between the red, green and blue signal transitions in analog video signals in a feedback manner to the phase of a dot clock signal that has been regenerated from a horizontal synchronization signal, in order to synchronize the display of image data. In general, the apparatus includes a differentiator for receiving the analog video signal and extracting signal transitions from the red, green and blue components of the video signal; a pulse shaping circuit for eliminating amplitude variations in the signal transitions; a phase detector circuit for detecting the phase measurements of the signal transitions between the red, green and blue components of the video signal, and for generating a sampling signal representative of the phase difference of the signal transitions; a sample and hold circuit for converting the sampling signal from a first analog signal into a digital signal, and then converting the digital signal into a second analog signal after a preset time period; a phase shifter for combining said second analog signal with the horizontal synchronization signal to adjust the phase of the dot clock signal. The phase adjusted clock signal can then be used by the display device to synchronize display image data and present a jitter-free screen image.

The method eliminates image detail timing jitters in digital display devices by compensating for the phase difference between the dot clock derived by the horizontal-sync signal and the display data. The method begins by receiving the analog video signal containing the red, green and blue signal transitions. These signals are added together, and any amplitude variations are evened out before the phase of each signal is measured. A sampling signal representative of the phase differences is then converted into the digital domain, held for a period of time, and converted back to the analog domain. This second analog signal, which is preferably filtered and amplified, is used in a feedback fashion to control the phase of the dot clock signal that has been regenerated from the horizontal sync signal, thereby eliminating timing jitters.

DETAILED DESCRIPTION OF THE PRESENT INVENTION

The present invention overcomes the problem of image detail timing jitters in FPDs by compensating for H-sync signal uncertainty. This is done by providing an apparatus and method for detecting the phase difference between red, green and blue signal transitions and the phase of the regenerated pixel clock. The detected phase difference is then applied, in a feedback fashion, to synchronize the dot clock phase with the signal transitions.

Figure 1:
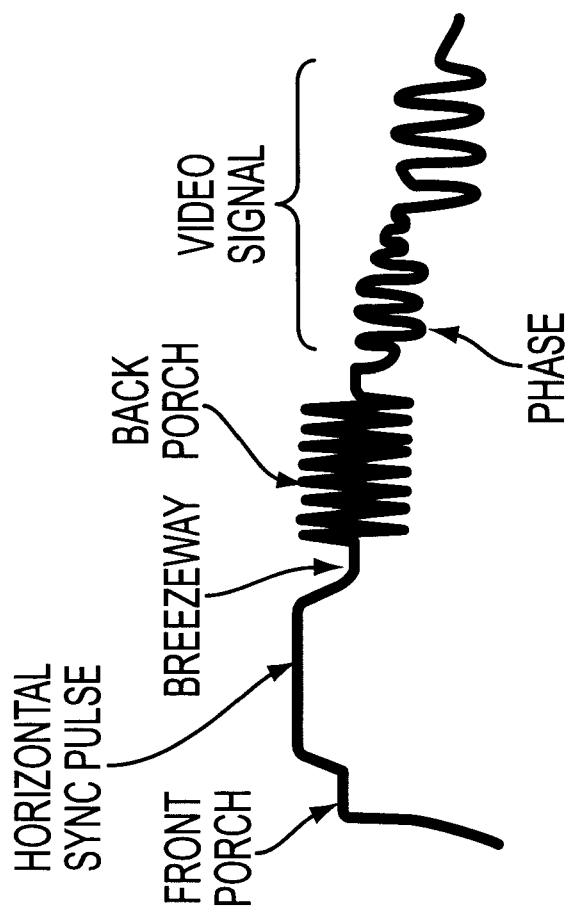
FIG. 1 is a diagram of an analog video waveform.
Figure 2:
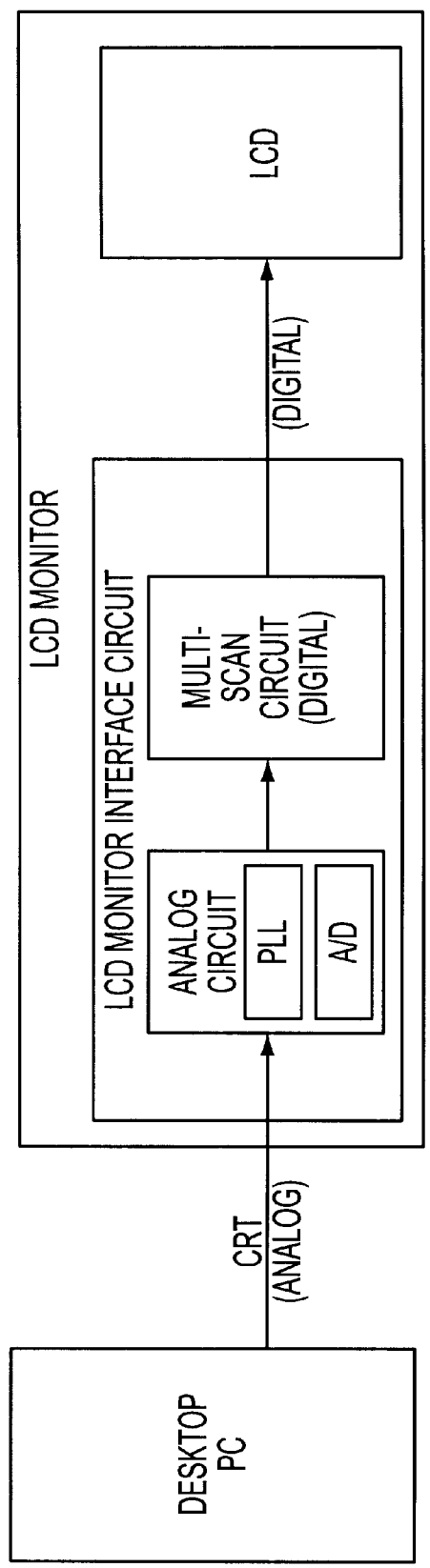
FIG. 2 is a block form diagram of a typical interface circuit for an LCD monitor connected to a general purpose computer.
Figure 3:
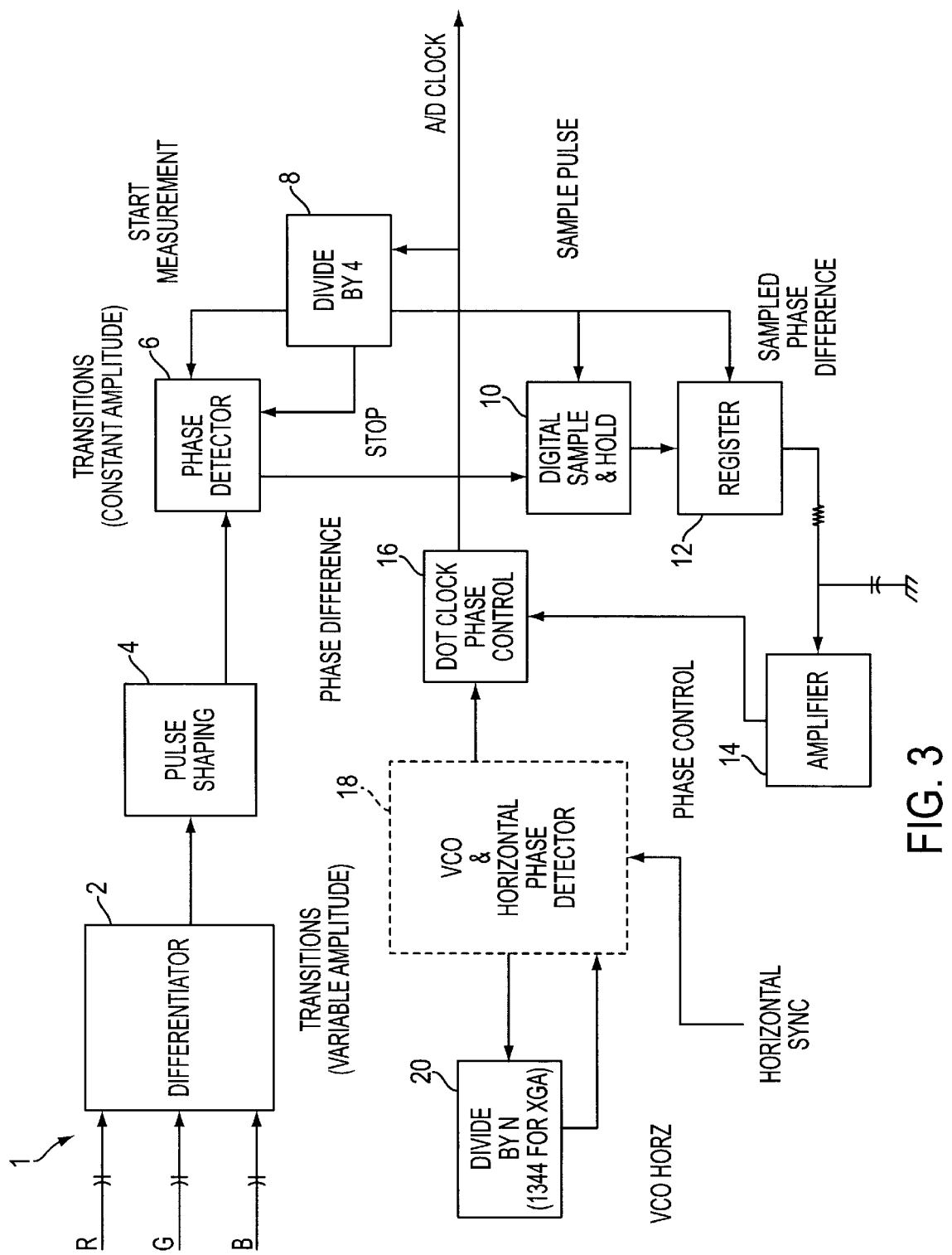
FIG. 3 is a block form diagram of one embodiment of a dot clock recovery circuit according to the present invention.

Referring now to the drawings, in which like numerals refer to like components, there is disclosed in FIG. 3 broad aspects of a preferred embodiment of the present invention. FIG. 3 discloses a general arrangement of dot clock recovery phased locked loop 1. As shown in FIG. 3, three analog color signals (red, green and blue) are applied to a differentiator circuit 2 so that the signal transitions can be extracted. The time intervals between the transitions will be variable because of the dependency upon the image itself. These intervals are proportional to the number of clock periods, which can vary from one to several thousand pixel periods. At the differentiator 2, the three signal streams are first differentiated and then added together to insure that all available transients are utilized for phase detection, as described below. Imaginary operator j*W, in frequency domain, corresponds to the differentiation operator d/dt in time domain.

In addition to the time interval variations, the amplitude of the combined stream varies, depending on the red and blue video signal amplitudes (saturation). To compensate for the amplitude variations, a preferred embodiment of the present invention employs a high speed limiter (not shown in FIG. 3) in a pulse shaping circuit 4 to even out the amplitude variations and produce constant amplitudes in the combined signal. In an alternative embodiment of the present invention (as described in a later embodiment), a high speed voltage comparator can also be used to eliminate the amplitude variations by setting the output voltage to the reference level voltage.

A phase detector circuit 6 receives the constant amplitude signal transitions from the output of pulse shaping circuit 4 and initiates the phase measurements of the signal transitions. Reference will now be made to FIG. 3 in combination with FIG. 5. Concurrently applied to the phase detector 6 is a first leading edge of a regenerated dot clock signal (using a divide-by-four circuit 8) that is communicated to the red, green and blue A/D converters (not shown). The leading edge of the regenerated dot clock pulse is used to initiate a linear ramp that is applied in the phase detection circuit 6. The falling edge of the first clock signal stops the linear ramp for several clock periods, and for four periods in the preferred embodiment. The second leading clock edge triggers a sampling pulse from the divide-by-four circuit 8, and is used to initiate the conversion of the analog ramp voltage, through a separate A/D converter in a digital sample and hold circuit 10, into the digital domain.

In the present invention, the phase detection circuit 6 uses a time independent storage means, as intervals between transients are of variable and unpredictable lengths. To this end, a sample hold period of several clock intervals is chosen to match the speed of the A/D converter in the sample and hold circuit 10. The phase detection circuit 6 outputs a sampling signal, representative of the phase difference in the combined transient signal, to the sample and hold circuit 10. A digital number representative of the sampled phase difference is then stored in a register 12.

The digitally sampled phase difference is converted back to the analog domain, filtered and amplified at amplifier circuit 14. The resulting analog voltage signal, slower but proportional to the phase difference of the red, green and blue signal transitions, is applied to a voltage controlled phase shifter, identified in FIG. 3 as dot clock phase control circuit 16. This path closes the phase control feedback loop, providing a phase range of ±120 degrees from the original dot clock period.

The foregoing feedback loop is combined with the H-sync signal processed by a horizontal phase detector circuit 18 (which employs a divider circuit 20 to handle the different image formats), at the dot clock phase control circuit 16. In essence, the regenerated clock frequency (from the H-sync signal) is phase adjusted (by the phase difference) at the dot clock phase control circuit 16. To coincide with the signal transitions, the dot clock control circuit 16 outputs a clock signal to the A/D converters (not shown) typically found in a display interface circuit.

Figure 4:
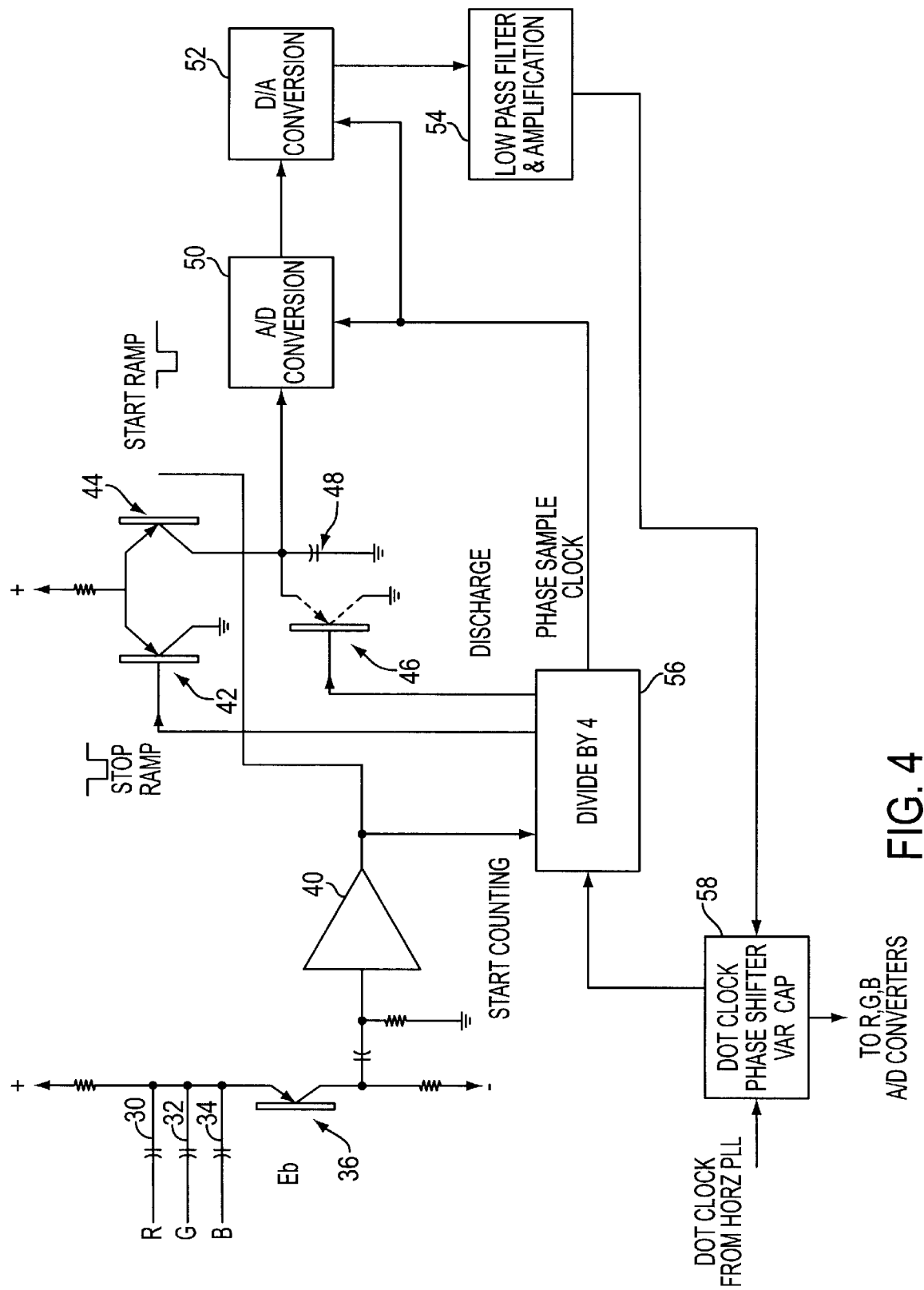
FIG. 4 is a schematic diagram of another embodiment of a dot clock recovery circuit according to the present invention.

FIG. 4 discloses a more detailed embodiment of the present invention. In the embodiment shown in FIG. 4, the red, green and blue color video signals are applied to capacitors 30, 32 and 34 respectively. The capacitors 30, 32 and 34 extract voltage transients from the corresponding red, green and blue waveforms, and in one preferred embodiment are equal to 10 pFarads each. The capacitors 30, 32 and 34 are connected in parallel to the emitter side of a radio frequency (RF) PNP transistor 36. These signals are AC coupled into emitter of PNP transistor 36, while output signals on the collector of PNP transistor 36 can be represented as:

$$J*W*C30*R(ed)+j*W*C30*G(reen)+j*W*C30*B(lue)$$

It is preferable that the PNP transistor 36 have a current-gain-bandwidth greater than 1.5 GHz, and a collector to base capacitance of less than 0.5 pF. The PNP transistor model no. MMBTH69 made by Motorola, Inc. for example, may be suitable for use in the present invention.

At the collector side of PNP transistor 36, a stream of transient signal pulses having varying amplitude levels (saturation) is applied to the input of a high speed limiter 40. The high speed limiter 40 amplifies the varying amplitudes to the same signal level so that amplitude equalization is achieved. Amplitude equalization is performed to generate digital drive pulses for initiating phase measurements. To this end, a preferred embodiment of the present invention employs a MAX3761 high speed limiter made by MAXIM Corporation.

Figure 5:
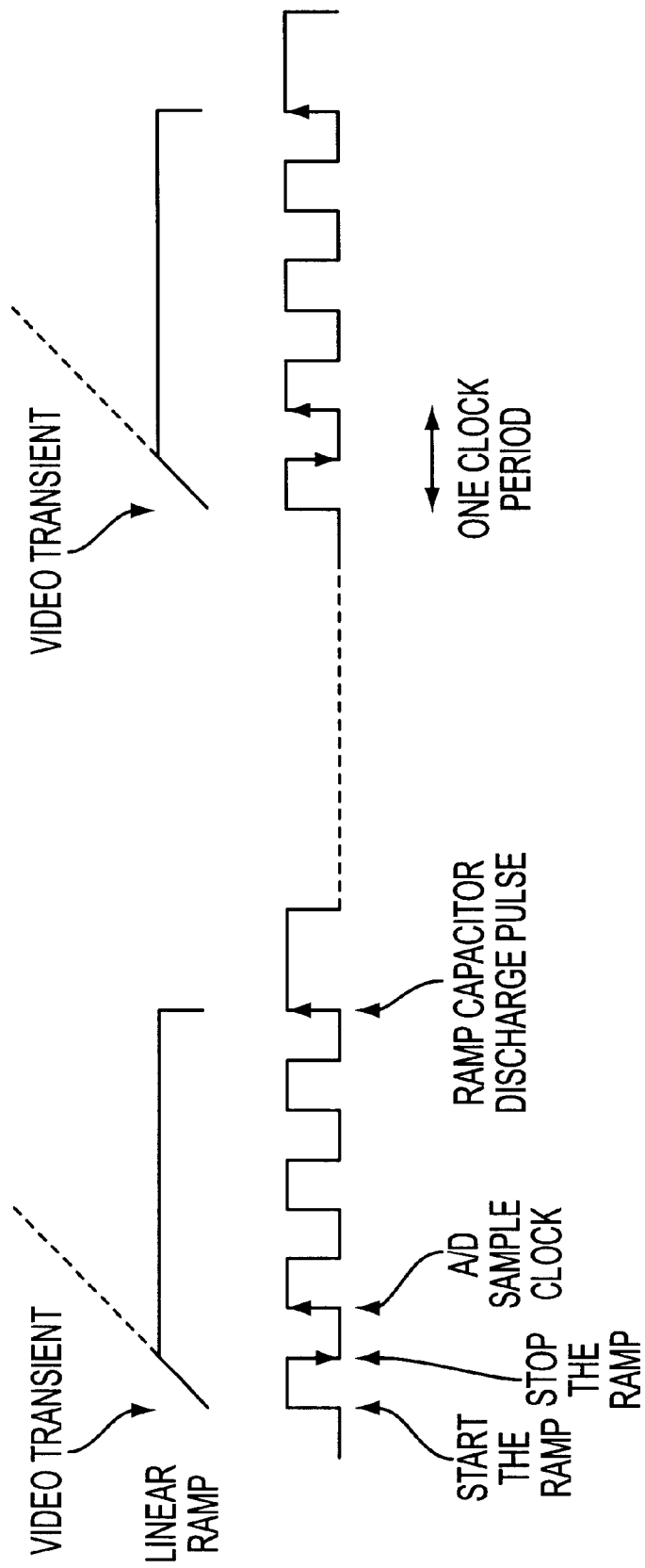
FIG. 5 is a graphical representation illustrating video signal and clock signal waveforms according to one embodiment of the present invention.

A transient pulse output from the high speed limiter 40 is applied to the base of a RF PNP transistor 44 to start the linear ramp of the video transient (see also FIG. 5). The transient pulse at the output of limiter 40 also enables a divide-by-four circuit 56. As shown in FIG. 5, the divide-by-four circuit 56 uses the first trailing or negative edge of a clock pulse to stop the ramp-up of the video transient. This is done through the base of another RF PNP transistor 42.

The leading edge of the next clock signal is used by the divide-by-four circuit 56 to enable an A/D conversion circuit 50 to sample the phase of the video transient and store a digital representation of the phase value into an 8-bit register (not shown). Four clock pulses after the first pulse that initiated the linear ramp, a ramp capacitor 48 is discharged through another RF PNP transistor 46. The next transient pulse starts the ramp up (charging capacitor 48) and the process starts again. In a preferred embodiment of the present invention, the functions of all three RF PNP transistors 42, 44 and 46 are implemented using MMBTH69 transistors manufactured by Motorola, Inc.

The register in the A/D conversion circuit 50 holds the sampled phase value until the next sample pulse occurs. This feature operates independent of time, since time intervals between transients vary from several clock periods to several thousand clock periods.

From the A/D conversion circuit 50, the digital phase sample is converted back to the analog domain by D/A conversion circuit 52. D/A conversion circuit 52 is enabled by the divide-by-four circuit 56 upon the arrival of an A/D sample clock pulse (see FIG. 5). After the D/A conversion circuit 52, the analog signal is filtered through a low pass circuit and amplified by a filter and amplification circuit 54 to reduce signal noise and provide a cleaner signal. These functions are performed to provide an analog signal suitable to drive a linear phase shifter 58 (described below).

The phase shifting function is implemented by a dot clock phase shifter 58 which receives the filtered and amplified phase signal at its input. The dot clock phase shifter 58 operates at full clock speed, and preferably at 65 MHz in the present invention. The dot clock phase shifter 58 also has an input coupled to the H-sync signal, as taught in the previously disclosed embodiment.

In order to adjust the H-sync signal by the phase difference input, the incoming H-sync signal is locked onto by a PLL circuit (not shown), and in a preferred embodiment a TLC2933 manufactured by Texas Instruments. Additionally, an ECL divider (not shown) is provided in such preferred embodiment to provide the function of dividing the dot clock signal down to the horizontal rate, since the TLC 2933 does not have this function built in. The phase difference signal is applied to a high speed operational amplifier and a varicap diode. The phase range provided by the dot clock phase shifter 58 is + or −4 ns, a phase shifting range of 180°.

The dot clock phase shifter 58 provides a regenerated clock signal (the H-sync signal adjusted by the R, G, B phase difference) at its input to the red, green and blue A/D converters (not shown) that convert analog display data from the host computer into digital data displayed by the FPD.

Figure 6:
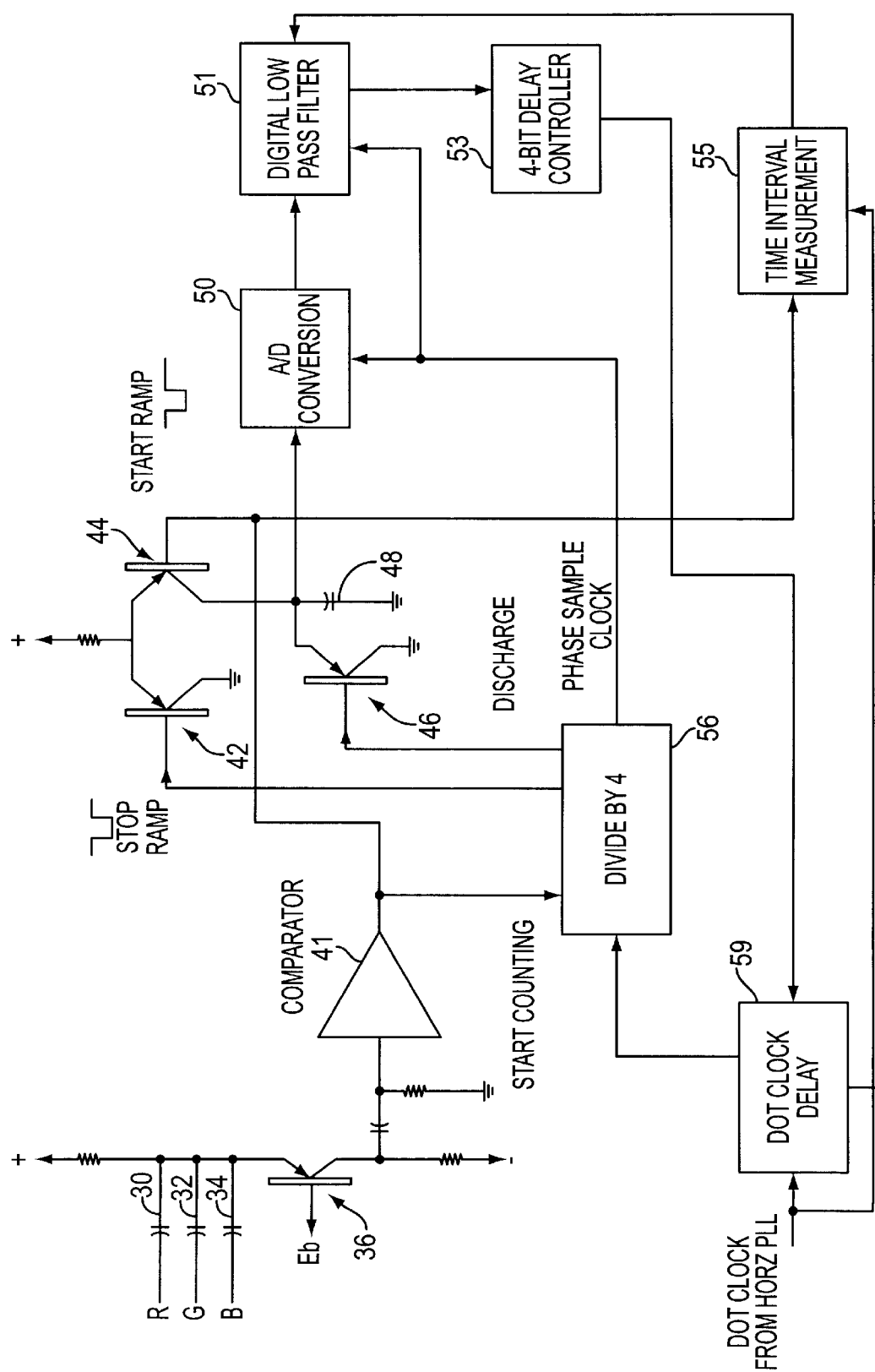
FIG. 6 is a schematic diagram of another embodiment of a dot clock recovery circuit according to the present invention.

Turning now to FIG. 6, another embodiment of the present invention is shown in a digital format. The elements in FIG. 6 that are labeled with numerals identical to those shown in FIG. 4 are like elements to those described in FIG. 4, and will be explained only in brief detail here.

As shown in FIG. 6, the red, green and blue analog video signals are applied to capacitors 30, 32 and 34 respectively to extract voltage transients. The capacitors 30, 32 and 34 are coupled to the emitter of an RF PNP transistor 36.

The collector of PNP transistor 36 applies varying amplitude video transient signals to the input of a high speed voltage comparator 41. The amplitude of the output waveform of comparator 41 is precisely set to be no greater than the reference voltage. In a preferred embodiment of the present invention, comparator 41 has rise and fall time values below 3 ns.

The output of comparator 41 is applied concurrently to PNP transistor 44 to start the linear ramp of the video transient signal, and to the divide-by-four circuit 56 to start counting the regenerated clock pulses. As in the previously described embodiment, the signal ramp is stopped after the first trailing edge of a clock pulse (see FIG. 5). This function is performed by one output of the divide-by-four circuit 56 being applied to the base of PNP transistor 42.

The leading edge of the next clock pulse causes the divide-by-four circuit 56 to enable the A/D conversion circuit 50. In a preferred embodiment of the present invention, four pulses after the initial clock pulse (that started the linear ramp), the divide-by-four circuit 56 triggers the discharge of ramp capacitor 48 via PNP transistor 42.

After the phase sampling and conversion from the analog to digital domain, the phase sample signal, converted into an 8 bit value in a preferred embodiment, is applied to a digital low pass filter 51. The digital low pass filter 51 provides both variable low pass frequency filtering and fixed low pass frequency filtering. In implementing variable filtering or adaptive low pass filtering, the filter response time will change proportionally to the time intervals between transient signals. Short time intervals will produce a fast response, while long time intervals will produce a slower response from the digital low pass filter 51.

The adaptive filter function requires the counting of time intervals. To this end, a time interval measurement circuit 55 is provided for measuring time intervals between transient signals in units of clock periods. The output of comparator 41 is applied to the input of the time interval measurement circuit 55, along with the H-sync signal provided by the host computer. In a preferred embodiment, the number of transients between each H-sync signal is measured. It should be understood that the present invention is not limited to measurement between horizontal scan lines, and that time interval measurement can also be accomplished between image frames in the alternative.

Figure 7:
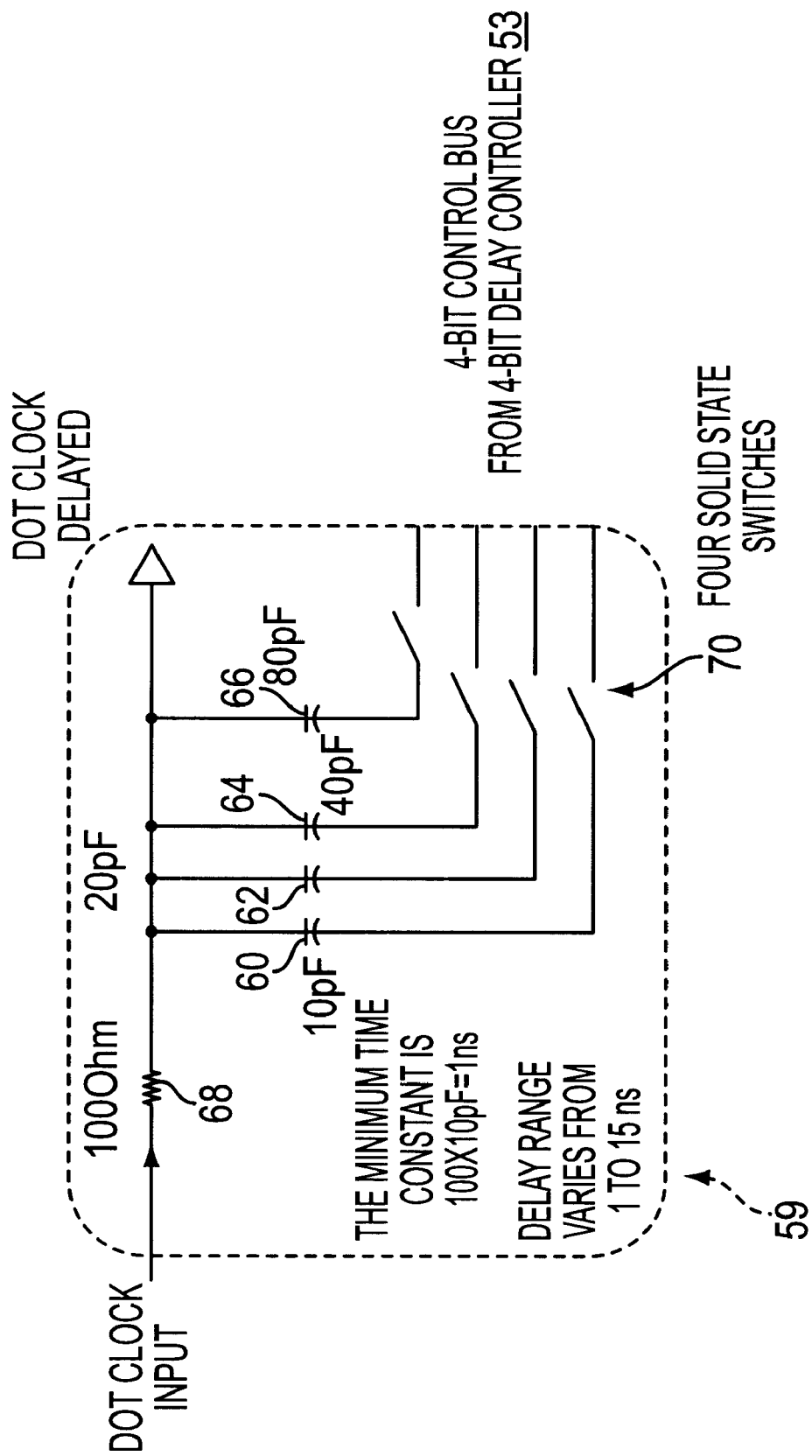
FIG. 7 is a detailed diagram of a dot clock delay circuit according to one embodiment of the present invention.

After the adaptive filtering has been performed by digital low pass filter 51, the phase signal representation is applied to a 4-bit delay controller 53 for phase control implementation. The delay controller 53 is coupled to a dot clock delay circuit 59 through a four bit control bus (see also FIG. 7). In one preferred embodiment of the present invention, the dot clock delay circuit 59, may be implemented in an R-C circuit. A plurality of low value capacitors 60, 62, 64 and 68 (shown in FIG. 7) may be employed in the dot clock phase shifter 59. For example, capacitors 60, 62, 64 and 68 with values such as 10, 20 40 and 80 pF respectively, in combination with a 100 Ohm resistor 68 can provide a delay to the H-sync signal in the range of 1–15 ns. For different image resolutions, such as XGA, VGA, etc., different capacitor values can be chosen. In addition, the number of capacitors chosen will determine how many bits will be needed from the digital low pass filter 51 to control the delay that the dot clock phase shifter 59 applies to the H-sync signal.

The various components of the PLL circuit 1 contemplated by the present invention may be implemented by direct electrical connection through customized integrated circuits, or a combination of circuitry and programming, using any of the methods known in the industry for providing the functions described herein without departing from the teachings of the invention. Those skilled in the art will appreciate that from the disclosure of the invention provided herein, commercial semiconductor integrated circuit technology would suggest numerous alternatives for actual implementation of the functions of the PLL circuit 1 that would still be within the scope of the invention.

As can be understood from the above-described different embodiments, the present invention accurately compensates for the phase difference between the H-sync signal and the display data by applying the phase difference in signal transients to the H-sync signal in a feedback manner. With the present invention, image data is converted with precision, but without the timing jitters of the prior art.

Although the present invention has been described in detail with particular reference to preferred embodiments thereof, it should be understood that the invention is capable of other and different embodiments, and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only, and do not in any way limit the invention, which is defined only by the claims.

What is claimed:

1. A digital display device having an apparatus for applying phase differences between red, green and blue signal transitions in analog video signals to a phase of a dot clock signal that has been regenerated from a horizontal synchronization signal in order to synchronize display of image data, said apparatus comprising:

a differentiator for receiving the analog video signal and extracting signal transitions from the red, green and blue components of the video signal;

a pulse shaper for eliminating amplitude variations in the signal transitions;

a phase detector for detecting the phase measurements of the signal transitions between the red, green and blue components of the video signal, and for generating a sampling signal representative of phase differences of each of the signal transitions;

a sample and hold means for converting the sampling signal from a first analog signal into a digital signal, and then converting the digital signal into a second analog signal after a preset time period;

a phase shifter for combining said second analog signal with the horizontal synchronization signal to adjust the phase of the horizontal synchronization signal and generate a clock signal in phase with said signal transitions in the video signal, wherein said clock signal is used by the display device to synchronize display image data.

2. A digital display device having an apparatus for processing analog video signals according to claim 1, further comprising a storage register for storing said first analog signal after it is converted into a digital signal.

3. A digital display device having an apparatus for processing analog video signals according to claim 1, further comprising an amplifier for amplifying said second analog signal.

4. A digital display device having an apparatus for processing analog video signals according to claim 1, further comprising a first divider circuit coupled to said first phase detector means for processing a plurality of dot clock signals by said first phase detector means.

5. A digital display device having an apparatus for processing analog video signals according to claim 1, further comprising a second phase detector means for detecting the phase measurements of the horizontal synchronization signal before it is combined with said second analog signal at said phase shifter.

6. A digital display device having an apparatus for processing analog video signals according to claim 5, further comprising a second divider circuit coupled to said second phase detector means for processing a plurality of image formats by said second phase detector means.

7. A method of synchronizing display of video image signals with a clock signal by applying phase differences between red, green and blue signal transitions in analog video signals to a phase of a horizontal synchronization signal, said method comprising:

extracting signal transitions from the red, green and blue components of the video signal;

detecting phase measurements of the signal transitions between the red, green and blue components of the video signal;

generating a sampling signal representative of phase differences of each of the signal transitions; and combining the phase differences of said sampling signal with the phase of the horizontal synchronization signal to adjust the phase of the horizontal synchronization signal and generate a clock signal in phase with said signal transitions in the video signal, and thereby synchronize display image data with the generated clock signal.

8. A method of synchronizing the display of video image signals according to claim 7 further comprises removing amplitude variations in the signal transitions after the red, green and blue components are extracted from the video signal.

9. A method of synchronizing the display of video image signals according to claim 7 further comprises converting the sampling signal from a first analog signal into a digital signal, and then converting the digital signal into a second analog signal after a preset time period.

10. A method of synchronizing the display of video image signals according to claim 7, further comprises storing said first analog signal after it is converted into a digital signal.

11. A method of synchronizing the display of video image signals according to claim 7, further comprises amplifying said second analog signal.

12. A method of synchronizing the display of video image signals according to claim 7, further comprises processing a plurality of dot clock signals when detecting the phase measurements of the signal transitions between the red, green and blue components of the video signal.

13. A method of synchronizing the display of video image signals according to claim 7 further comprises detecting the phase measurements of the horizontal synchronization signal before it is combined with sampling signal.

14. A method of synchronizing the display of video image signals according to claim 13, further comprises processing a plurality of image formats when detecting the phase measurements of the horizontal synchronization signal before it is combined with the sampling signal.

15. A method of synchronizing the display of video image signals according to claim 9 further comprises detecting the phase measurements of the horizontal synchronization signal before it is combined with said second analog signal.

16. A method of synchronizing the display of video image signals according to claim 15, further comprises processing a plurality of image formats when detecting the phase measurements of the horizontal synchronization signal before it is combined with said second analog signal.

17. An apparatus for synchronizing the display of image data with a dot clock signal that has been regenerated from a horizontal synchronization signal, said apparatus comprising:

a plurality of capacitors for receiving an analog video signal and extracting signal transients from the red; green and blue components of the video signal;

a comparator for eliminating amplitude variations in the signal transients;

a voltage sampling means for generating a sampling signal representative of phase differences of each of the signal transients;

a signal conversion means for converting the sampling signal between analog and digital domains; and a phase shifter means for combining said converted sampling signal with the horizontal synchronization signal to adjust the phase of the horizontal synchronization signal and to generate a clock signal in phase with said signal transients in the video signal, to thereby synchronize display image data.

18. An apparatus for synchronizing the display of image data with a dot clock signal according to claim 17, wherein said comparator is a high speed limiter circuit.

19. An apparatus for synchronizing the display of image data with a dot clock signal according to claim 17, further comprising a low pass filtering means for providing frequency or noise filtering.

20. An apparatus for synchronizing the display of image data with a dot clock signal according to claim 19, further comprising an amplifier for amplifying the filtered signal.

21. An apparatus for synchronizing the display of image data with a dot clock signal according to claim 19, further comprising a delay controller coupled to said low pass filtering means and said phase shifter means for controlling a delay that said phase shifter means applies to the horizontal synchronization signal.

22. An apparatus for synchronizing the display of image data with a dot clock signal according to claim 21, further comprising a time interval measurement circuit coupled to said phase shifter means to measure time intervals between signal transients.

23. A digital display device having an apparatus for applying phase differences between the red, green and blue signal transitions in analog video signals in a feedback manner to a phase of a dot clock signal that has been regenerated from a horizontal synchronization signal, to synchronize display of image data including a differentiator for receiving an analog video signal and extracting signal transitions from the red, green and blue components of the video signal; means for eliminating amplitude variations in the signal transitions; a phase detector circuit for detecting phase measurements of the signal transitions between the red, green and blue components of the video signal, and for generating a sampling signal representative of the phase differences of each of the signal transitions; a sample and hold circuit for converting the sampling signal from a first analog signal into a digital signal, and then converting the digital signal into a second analog signal after a preset time period; and a phase shifter for combining said second analog signal with the horizontal synchronization signal to adjust the phase of the dot clock signal, the phase adjusted clock signal then being used by the display device to synchronize display image data and present a jitter-free screen image.

24. A method for eliminating image detail timing jitters in digital display devices by compensating for a phase difference between a dot clock derived by a horizontal-sync signal and display data, comprising receiving an analog video signal containing red, green and blue signal transitions, adding the signal transitions together, evening out amplitude variations before phase differences of each of the signal transitions is measured, establishing a sampling signal representative of the phase differences between the signal transitions, converting the sampling signal into the digital domain, holding the sampling signals for a period of time, converting the sampling signal back to the analog domain as a second analog signal, and the second analog signal is used in a feedback fashion to control the phase of a dot clock signal that has been regenerated from the horizontal sync signal, thereby eliminating timing jitters.

\* \* \* \* \*

UNITED STATES PATENT AND TRADEMARK OFFICE
CERTIFICATE OF CORRECTION

PATENT NO. : 6,226,045 B1
DATED : May 1, 2001
INVENTOR(S) : Nikola Vidovich

Page 1 of 1

It is certified that error appears in the above-identified patent and that said Letters Patent is hereby corrected as shown below:

<u>Title page,</u>
Item [73] Assignee, should read as follows:
-- Hitachi America, Ltd., Tarrytown, NY --.

Signed and Sealed this

Eleventh Day of December, 2001

Attest:

*Nicholas P. Godici*

NICHOLAS P. GODICI
*Attesting Officer*   *Acting Director of the United States Patent and Trademark Office*